United States Patent
Tong et al.

(10) Patent No.: US 10,498,346 B2
(45) Date of Patent: Dec. 3, 2019

(54) MIDBAND PHASE NOISE REDUCER FOR PLLS

(71) Applicant: RAYTHEON COMPANY, Waltham, MA (US)

(72) Inventors: Tuan M. Tong, Frisco, TX (US); William K. Mcgehee, Mckinney, TX (US); Michael R. Patrizi, Allen, TX (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/808,815

(22) Filed: Nov. 9, 2017

(65) Prior Publication Data

US 2019/0140653 A1    May 9, 2019

(51) Int. Cl.
*H03L 7/06*    (2006.01)
*H03L 7/18*    (2006.01)
*H03L 7/24*    (2006.01)
*H03L 7/20*    (2006.01)

(52) U.S. Cl.
CPC .................. *H03L 7/18* (2013.01); *H03L 7/20* (2013.01); *H03L 7/24* (2013.01); *H03L 2207/10* (2013.01)

(58) Field of Classification Search
CPC ........... H03D 7/00; H04L 27/12; H04L 27/14; H01S 3/0057; H01S 3/0092
See application file for complete search history.

(56) References Cited

U.S. PATENT DOCUMENTS

| | | | |
|---|---|---|---|
| 5,187,722 A | 2/1993 | Petty | |
| 5,347,232 A * | 9/1994 | Nishimichi | H03L 7/087 331/1 A |
| 5,781,600 A * | 7/1998 | Reeve | H03L 7/16 327/157 |
| 5,973,570 A | 10/1999 | Salvi et al. | |
| 6,242,899 B1 * | 6/2001 | Miller | G01R 13/345 324/76.24 |
| 8,878,575 B1 | 11/2014 | Blumke et al. | |
| 2005/0151592 A1 * | 7/2005 | Partridge | H03B 5/04 331/16 |
| 2007/0080852 A1 | 4/2007 | Blumke et al. | |

(Continued)

FOREIGN PATENT DOCUMENTS

WO    WO 2007/030485 A2    3/2007

OTHER PUBLICATIONS

International Search Report from related International Application No. PCT/US2018/059684, International Search Report dated Mar. 1, 2019 and dated Mar. 8, 2019 (4 pgs.).

(Continued)

*Primary Examiner* — Sibin Chen
(74) *Attorney, Agent, or Firm* — Lewis Rocca Rothgerber Christie LLP

(57) ABSTRACT

A signal generator. A voltage controlled oscillator generates a signal that is fed to a comb generator, e.g., a nonlinear transmission line. A tone, from among a comb of tones at the output of the comb generator, is selected by a bandpass filter, its frequency is divided, e.g., by a direct digital synthesizer, and the result is compared, e.g., by a phase and frequency detector that receives a reference signal at its other input. The output of the phase and frequency detector is fed back, e.g., through a lowpass filter, to the voltage controlled oscillator.

28 Claims, 7 Drawing Sheets

(56) References Cited

U.S. PATENT DOCUMENTS

2007/0205836 A1    9/2007  Xu
2007/0273454 A1*  11/2007  Pepper ................... H03B 19/05
                                                                             333/20
2009/0278615 A1    11/2009  Nakatsuka

OTHER PUBLICATIONS

Written Opinion of the International Searching Authority from related International Application No. PCT/US2018/059684, dated Mar. 8, 2019 (8 pgs.).

* cited by examiner

US 10,498,346 B2

MIDBAND PHASE NOISE REDUCER FOR PLLS

FIELD

One or more aspects of embodiments according to the present invention relate to signal generators, and more particularly to a low noise and low spurious comb generator.

BACKGROUND

In a high-frequency signal generator, a phase locked loop may be used as a signal source driving a multiplying circuit, such as a nonlinear transmission line. In such a system, if the frequency of the phase locked loop is multiplied by a factor of N, the spurious performance may be degraded by a factor of 20*Log(N). This degradation in performance may adversely affect system performance.

Thus, there is a need for an improved high-frequency signal generator.

SUMMARY

Aspects of embodiments of the present disclosure are directed toward a signal generator. A voltage controlled oscillator generates a signal that is fed to a comb generator, e.g., a nonlinear transmission line. A tone, from among a comb of tones at the output of the comb generator, is selected by a bandpass filter, its frequency is divided, e.g., by a direct digital synthesizer, and the result is compared to a reference signal, e.g., by a phase and frequency detector that receives the result at one input and that receives the reference signal at another input. The output of the phase and frequency detector is fed back, e.g., through a lowpass filter, to the voltage controlled oscillator.

According to an embodiment of the present invention there is provided a signal generator, including: a voltage controlled oscillator; a comb generator having an input operatively coupled to an output of the voltage controlled oscillator; a first filter having an input connected to an output of the comb generator; a first frequency divider having an input connected to an output of the first filter; and a signal comparator having a feedback input connected to an output of the first frequency divider and a reference input, the signal comparator having a first output and being configured to generate at the first output a signal that is a measure of: a phase difference; or a frequency difference between a signal at the feedback input and a signal at the reference input, the first output of the signal comparator being operatively coupled to a control input of the voltage controlled oscillator.

In one embodiment, the first filter is a bandpass filter.

In one embodiment, the comb generator is a nonlinear transmission line.

In one embodiment, the signal includes an amplifier having an input connected to the output of the voltage controlled oscillator and an output connected to the input of the comb generator.

In one embodiment, the comb generator is a nonlinear transmission line.

In one embodiment, the amplifier is configured to provide, to the nonlinear transmission line, a signal having a power of between 18 dBm and 24 dBm.

In one embodiment, the first frequency divider is a direct digital synthesizer.

In one embodiment, the direct digital synthesizer has a frequency ratio between 2 and 20.

In one embodiment, the signal includes a processing circuit configured to control the frequency ratio of the direct digital synthesizer.

In one embodiment, the processing circuit is further configured to adjust the frequency ratio monotonically up or monotonically down, during an interval of time.

In one embodiment, the comb generator is a nonlinear transmission line.

In one embodiment, the first filter is a bandpass filter.

In one embodiment, the signal comparator is a phase and frequency detector.

In one embodiment, the signal includes a second filter connected between the phase and frequency detector and the voltage controlled oscillator, the second filter being a lowpass filter.

In one embodiment, the signal includes a second frequency divider connected between the voltage controlled oscillator and the comb generator.

In one embodiment, the second frequency divider is configured to receive from the voltage controlled oscillator a signal having a first frequency and to feed to the comb generator a signal having a frequency that is ½ of the first frequency.

In one embodiment, the signal includes an amplifier having an input connected to the output of the second frequency divider and an output connected to the input of the comb generator.

In one embodiment, the comb generator is a nonlinear transmission line.

In one embodiment, the signal generator is capable of generating a signal with a power of at least −12 dBm at a first frequency, the first frequency being at least 10 GHz, and with maximum spurious levels, within a 1 GHz span centered on the first frequency, of less than −65 dBm.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a phase noise reducer provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1A:
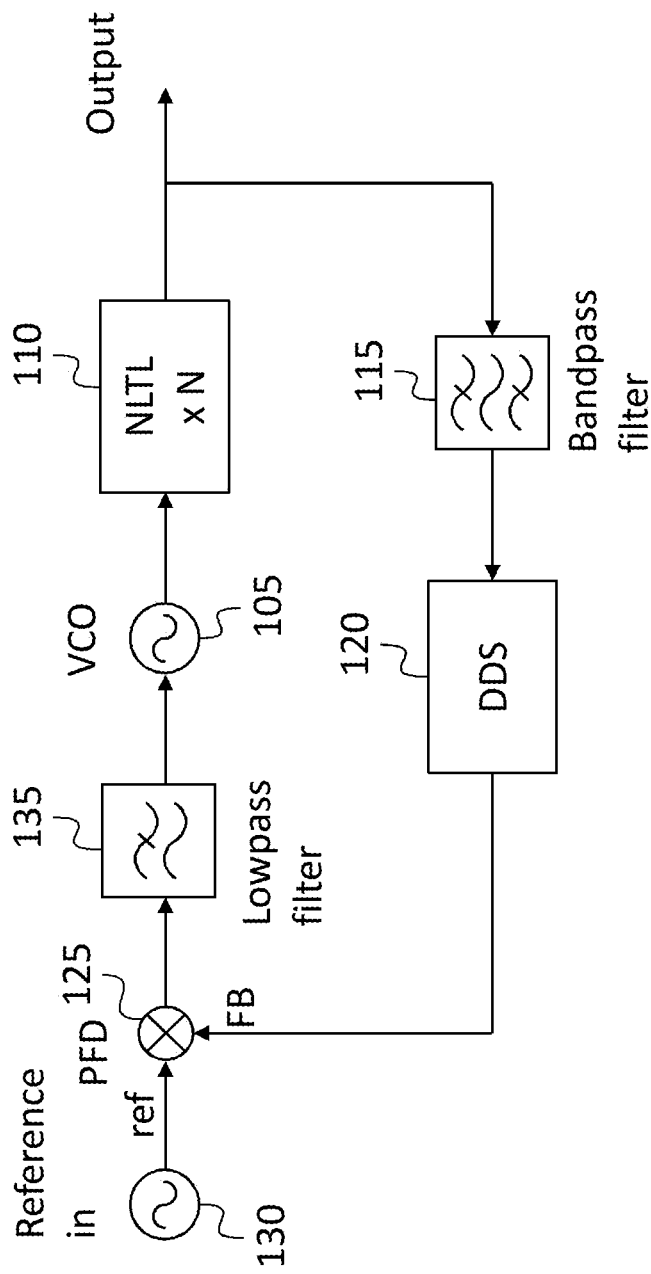
FIG. 1A is a block diagram of a signal generator, according to an embodiment of the present invention.

Referring to FIG. 1A, in some embodiments a signal generator includes a voltage controlled oscillator 105 connected to a nonlinear transmission line 110, which is connected to a bandpass filter 115, which is connected to a direct digital synthesizer (DDS) 120. The direct digital synthesizer 120 is in turn connected to a feedback input of a phase and frequency detector 125 that also has a reference input connected to a frequency reference 130. The output of the phase and frequency detector 125 is connected, through a lowpass filter 135, to a control input of the voltage controlled oscillator 105 (i.e., the phase and frequency detector 125 is operatively coupled to the control input of the voltage controlled oscillator 105).

In operation, the voltage controlled oscillator 105 generates a sinusoidal signal which is fed to the nonlinear transmission line 110. The nonlinear transmission line 110 may be a periodic network of series inductors and shunt capacitors, with the capacitors being varactors, or with each capacitor being a parallel combination of a conventional (linear) capacitor and a varactor. Each varactor may be a nonlinear, e.g., voltage-dependent, capacitor.

The nonlinear transmission line 110 may have nonlinear characteristics that cause it to produce, at its output, a plurality of harmonics of the signal at its input. When driven by an input signal having a suitable amplitude, the nonlinear transmission line 110 may perform waveform steepening, i.e., the rising or falling portions (or both) of the sinusoidal input waveform may become steeper. As a result, the nonlinear transmission line 110 may act as a comb generator, i.e., the amplitudes, at the output of the nonlinear transmission line 110, of some of the harmonics and of the fundamental, may be comparable, so that the spectrum of the output of the nonlinear transmission line 110, and at the output of the signal source, has the shape of a comb. For example, the output may have a spectrum that includes tones at the fundamental frequency and at 10 harmonics, with the amplitude of the largest of these 11 tones differing from the amplitude of the smallest of these tones by no more than 10 dB, including a lowest-frequency peak at the input frequency and a plurality of peaks at multiples (i.e., harmonics) of the input frequency. The nonlinear transmission line 110 may be a model MLPNC-710351 nonlinear transmission line comb generator available from MACOM™ (www.macom.com). The nonlinear transmission line 110 may produce an acceptable comb spectrum for input power greater than 15 dBm, or, in some embodiments, for input power in the range between 18 dBm and 24 dBm. The tones (i.e., the fundamental and the harmonics) in the output of the signal source may be phase coherent with each other. A system (e.g., a radar system, an atomic clock, or an optical communications system), in which the signal source is used, may be able to switch between the tones and retain phase memory while doing so. In some embodiments a comb generator different from a nonlinear transmission line, such as a step recovery diode (SRD), may be used. In some embodiments, the comb generator (e.g., the nonlinear transmission line 110) is configured to generate, at an output of the comb generator, a plurality of tones including a tone at the fundamental frequency and a tone at a harmonic of the fundamental frequency, the frequency of the tone at the harmonic of the fundamental frequency being at least 4 times the fundamental frequency, and the amplitude of the tone at the harmonic of the fundamental frequency being at least 0.01 of the amplitude of the tone at the fundamental frequency. In another embodiment, the comb generator generates a fundamental and a plurality of harmonics, with the 20th harmonic having an amplitude that is between 20 dB and 30 dB less (e.g., 25 dB less) than the amplitude of the fundamental. In some embodiments, an HMC440 integer-N synthesizer (available from Analog Devices, www.analog.com) is used as the phase detector 125, a VS300-001 voltage controlled oscillator (available from Vectron, www.vectron.com) is used as the VCO 105, and an AD9914 direct digital synthesizer (available from Analog Devices, www.analog.com) is used as the DDS 120.

The phase and frequency detector 125 may operate as a signal comparator. As used herein, a "signal comparator" is a circuit with two inputs that measures a frequency difference and/or a phase difference between two signals received at the respective inputs. The phase and frequency detector 125 may generate two output signals, one being a measure of the frequency difference between the respective signals at the feedback input (labeled "FB" in FIG. 1A) and at the reference input (labeled "ref" in FIG. 1A), and the other being a measure of the phase difference between the respective signals at the feedback input and at the reference input. The phase and frequency detector 125 may divide the frequency of the signal at the feedback input (labeled "FB" in FIG. 1A) by two, so that if the reference frequency is 320 MHz for example, and the output frequency of the direct digital synthesizer 120 is 640 MHz, the phase and frequency detector 125 detects a frequency difference of zero. The circuit may use only the phase output (i.e., the output at which the signal is a measure of the phase difference between the respective signals at the feedback input and at the reference input) as shown in FIG. 1A. In some embodiments both outputs of the phase and frequency detector 125 may be used. For example, when the frequency difference is sufficiently large to make lock acquisition using the phase output challenging, the frequency output may initially be used to control the voltage controlled oscillator 105 until the frequency difference is small.

The bandpass filter 115 may select one of the harmonics at the output of the nonlinear transmission line 110; after being filtered by the bandpass filter 115, this harmonic is then fed to the clock input of the direct digital synthesizer 120. If the first harmonic is to be used for the feedback, a lowpass filter may be used in place of the bandpass filter 115. A direct digital synthesizer 120 may have a clock or "sampling clock" input and an output. The signal at the output may be updated once per clock cycle of the sampling clock signal received at a sampling clock input of the direct digital synthesizer 120. The direct digital synthesizer 120 may include a look-up table and a digital-to-analog converter (DAC). A pointer in the lookup table may be adjusted once per cycle of the sampling clock signal, and at each clock cycle, the value identified by the pointer, in the lookup table, may be sent to the DAC, converted to an analog voltage, and provided at the output of the direct digital synthesizer 120. The amount by which the pointer is adjusted may be determined by a phase accumulator that calculates, for a given required output frequency (referred to as the fundamental tone), the phase of the output for each sampling clock cycle. Thus, by selecting the phase increment, the direct digital synthesizer 120 may be configured to generate an approximately sinusoidal output signal with a fundamental tone at a frequency that is a fraction of the sampling clock frequency. Accordingly, the direct digital synthesizer 120 operates as a frequency divider, and in some embodiments another type of frequency divider, e.g., a digital frequency divider, is used in place of the direct digital synthesizer 120. The ratio of the fundamental tone to the sampling clock frequency is referred to herein as the "frequency ratio" to which the direct digital synthesizer 120 is set, i.e., with which the direct digital synthesizer 120 is configured. If the output frequency is one-tenth of the sampling clock frequency, for example (a frequency ratio of 0.1), then the phase accumulator may generate an output that advances by $\frac{1}{10}^{th}$ cycle (36 degrees) for each cycle of the sampling clock. The output of the direct digital synthesizer 120 may then be a step-wise (or "piece-wise constant") approximation to a sine wave at a frequency that is $\frac{1}{10}^{th}$ of the sampling clock frequency.

Figure 1B:
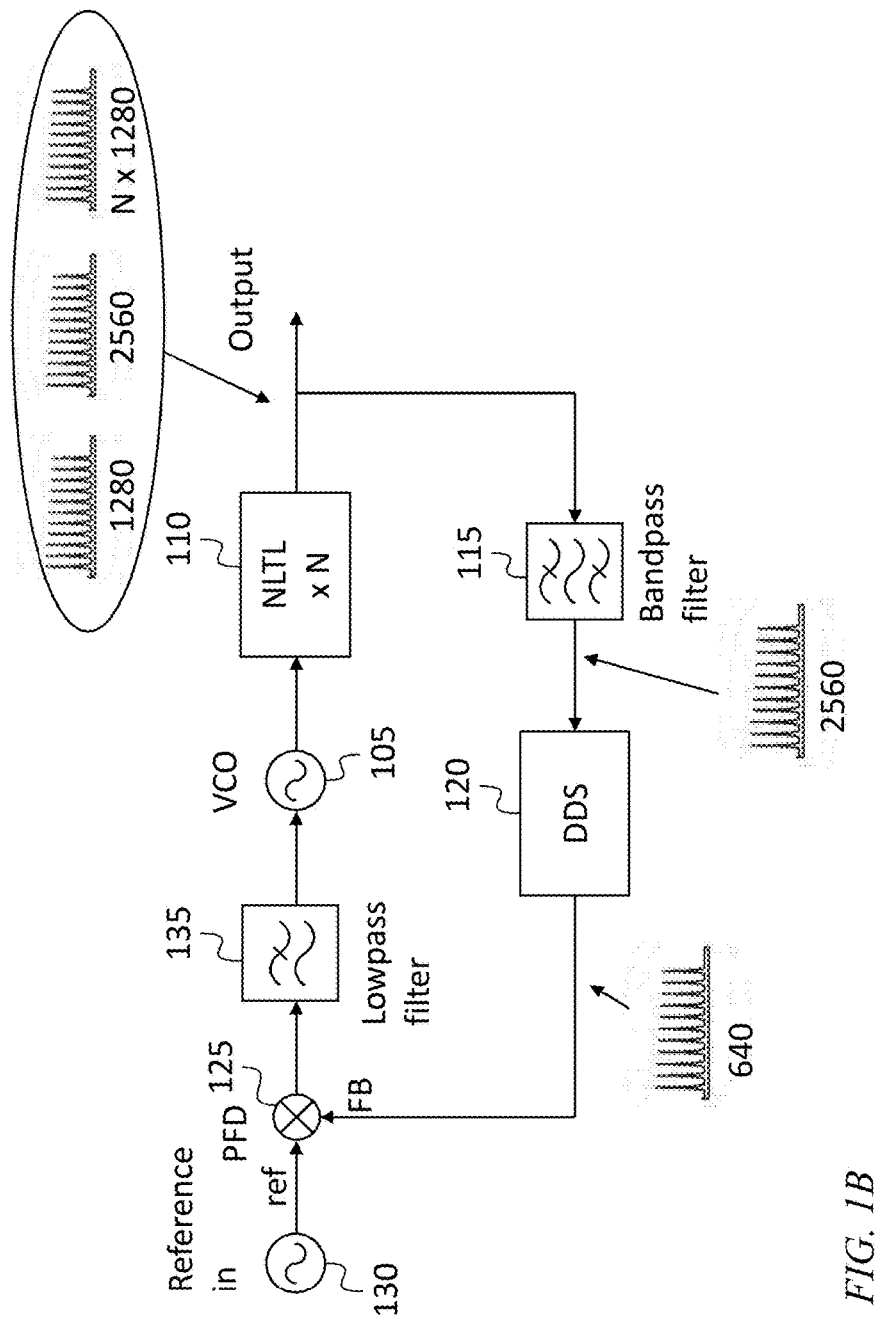
FIG. 1B is a block diagram of a signal generator, according to an embodiment of the present invention.

Because of the frequency conversions that occur in the nonlinear transmission line 110 and in the direct digital synthesizer 120, various frequencies within the signal generator may be different from the frequency of the frequency reference 130. For example, the frequency at the output of the voltage controlled oscillator 105, the frequencies at the output of the nonlinear transmission line 110, the frequency at the output of the bandpass filter 115, and the frequency at the output of the direct digital synthesizer 120 may all differ from the frequency of the frequency reference 130. Referring to FIG. 1B, in some embodiments the frequency at the output of the frequency reference 130 is 320 MHz, the nominal frequency at the output of the voltage controlled oscillator 105 is 1280 MHz, the nominal frequency at the output of the bandpass filter 115 is 2560 MHz (i.e., the bandpass filter 115 selects, from among the frequencies at the output of the nonlinear transmission line 110, the second harmonic of the frequency at the output of the voltage controlled oscillator 105, and the nominal frequency at the output of the direct digital synthesizer 120 is 640 MHz (i.e., the frequency ratio of the direct digital synthesizer 120 is set to 0.25).

The frequency ratio of the direct digital synthesizer 120 may be adjusted during operation. The signal generator may employ feedback control, e.g., the signal loop of FIGS. 1A and 1B (including a forward path through the voltage controlled oscillator 105 and the nonlinear transmission line 110, and a reverse path through the bandpass filter 115 and the direct digital synthesizer 120) may operate as a feedback loop. Because the feedback tends to keep the frequency ratio, and the relative phase of the two signals at the two inputs of the phase and frequency detector 125, fixed, varying the frequency ratio of the direct digital synthesizer 120 causes the frequency at the output of the voltage controlled oscillator 105 to vary. In this manner, all of the frequencies in the system, except for the frequency at the output of the frequency reference 130 and the frequency at the output of the direct digital synthesizer 120 may be varied, e.g., chirped. A subsequent circuit, e.g., a radar transmitter, that amplifies and transmits one of the harmonics of the frequency at the output of the signal generator (e.g., by selecting that output from the output of the nonlinear transmission line 110) may then receive a chirped signal. The comb-like spectra illustrated in FIG. 1B are intended to show an array of frequencies that may be generated by such chirping. The direct digital synthesizer 120 may include an internal controller (or it may be connected to an external controller) that controls the frequency ratio of the direct digital synthesizer 120 and that may, for example, cause it to vary with time, to produce a chirp at the output of the signal generator. The chirping may be accomplished by adjusting the frequency ratio monotonically up, or monotonically down, during an interval of time. The controller may be a processing circuit, as discussed in further detail below.

Figure 1C:
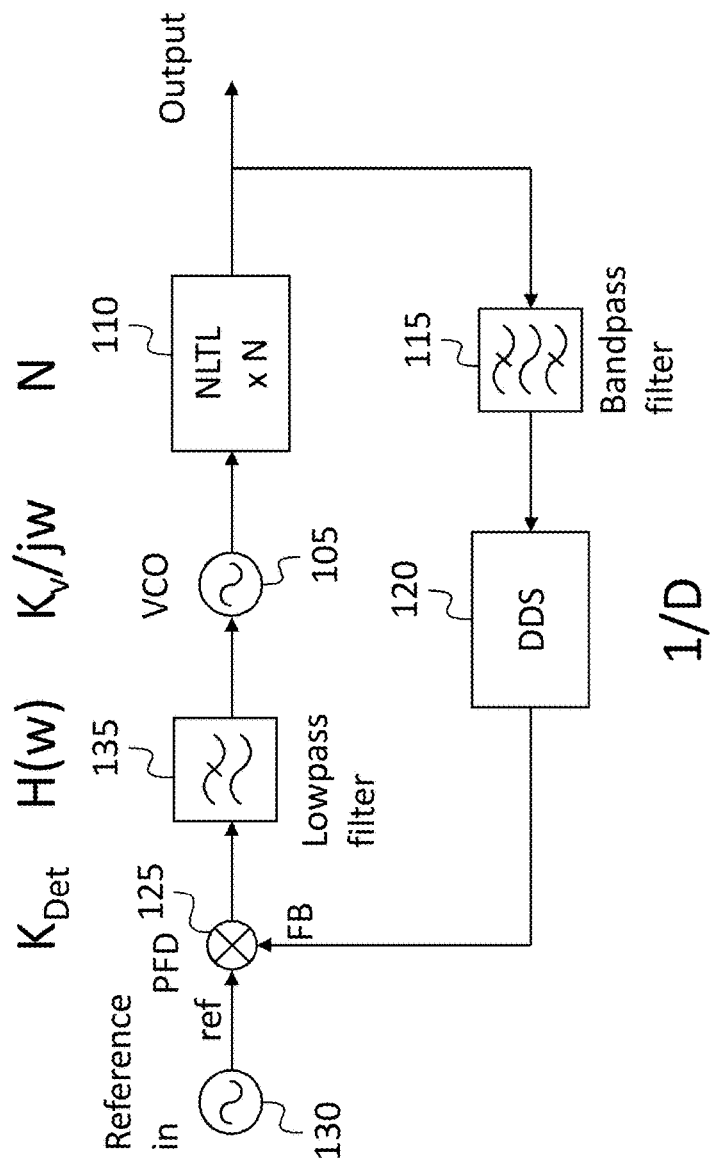
FIG. 1C is a block diagram of a signal generator, according to an embodiment of the present invention.

Referring to FIG. 1C, in some in some embodiments the loop gain of the circuit may be calculated by taking the product, for all of the blocks, of the gain or transfer function of each block. For example, the gain of the phase and frequency detector 125 may be $K_{Def}/M$ (a constant, where M is the ratio (e.g., 2), when the output of the phase and frequency detector 125 is zero, of (i) the frequency at the feedback input of the phase and frequency detector 125 and (ii) the frequency at the reference input of the phase and frequency detector 125). The transfer function of the low-pass filter 135 may be H(w) (where w is the angular frequency), the gain of the voltage controlled oscillator 105 (i.e., the ratio of (i) the phase change in the signal at the output of the voltage controlled oscillator 105 to (ii) the voltage change at the input of the voltage controlled oscillator 105) may be $K_v/jw$ (where $K_v$ is a constant), the gain of the nonlinear transmission line 110 may be N, and the gain of the direct digital synthesizer 120 may be 1/D (the frequency ratio). Accordingly, the loop gain may be given by:

$$T(w)=K_{Def}H(w)K_vN/(jwMD).$$

This loop gain (T(w)) is a function of frequency and it may have the characteristic of having a relatively large value at low frequency, a value that decreases with increasing frequency at high frequency, and a value of unity at an intermediate frequency, referred to herein as the "unity gain frequency". The unity gain frequency may be between 100 Hz and 500 Hz, e.g., it may be about 250 Hz.

The circuit of FIGS. 1A-1C may exhibit low phase noise and low spurious (or "spur") levels. Spurious levels are a measure of narrowband features, or tones, in the output spectrum of a signal generator that are at frequencies other than the useful output tone(s) of the signal generator. These spurious tones may be generated as harmonics of the useful frequencies in the circuit and as intermodulation products between the tones in the circuit (including the useful tones, the harmonics, and other intermodulation products). A measure of spurious performance is the ratio of a spurious tone to the carrier, expressed, for example, in decibels (dBc). The inclusion of the nonlinear transmission line 110 in the loop (as in FIGS. 1A-1C) may improve the spurious performance of the circuit, and the phase noise, compared to, for example, a circuit consisting of a phase locked loop driving a nonlinear transmission line that is cascaded with (not integrated into) the phase locked loop. The use of the direct digital synthesizer 120 may also improve the spurious performance of the circuit, and the phase noise, compared to, for example, a circuit in which frequency division is performed in the loop by a digital frequency divider (e.g., a counter), the output of which may be a square wave (instead of a piece-wise constant approximation to a sine wave, having potentially four or more piece-wise constant segments per cycle), and which may, as a result, include significant power in harmonics of the fundamental output frequency of the frequency divider.

Figure 1D:
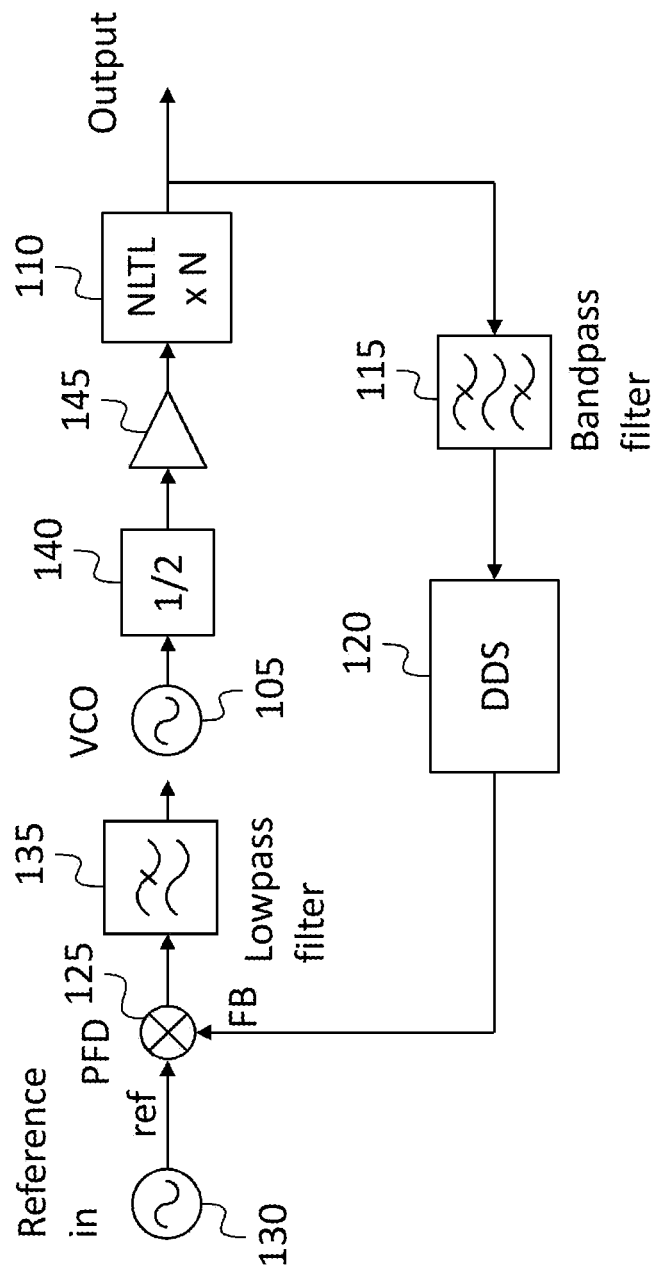
FIG. 1D is a block diagram of a signal generator, according to an embodiment of the present invention.

In some embodiments, a frequency divider 140 and/or an amplifier 145 may be connected between the voltage controlled oscillator 105 and the nonlinear transmission line 110 as shown in FIG. 1D. The frequency divider 140 may reduce the frequency by a factor of two (e.g., if the frequency at the output of the voltage controlled oscillator 105 is 2560 MHz, the frequency at the output of the frequency divider 140 may be 1280 MHz). The amplifier may be configured to provide a power level at the input of the nonlinear transmission line 110 that allows it to operate effectively as a comb generator.

Figure 2:
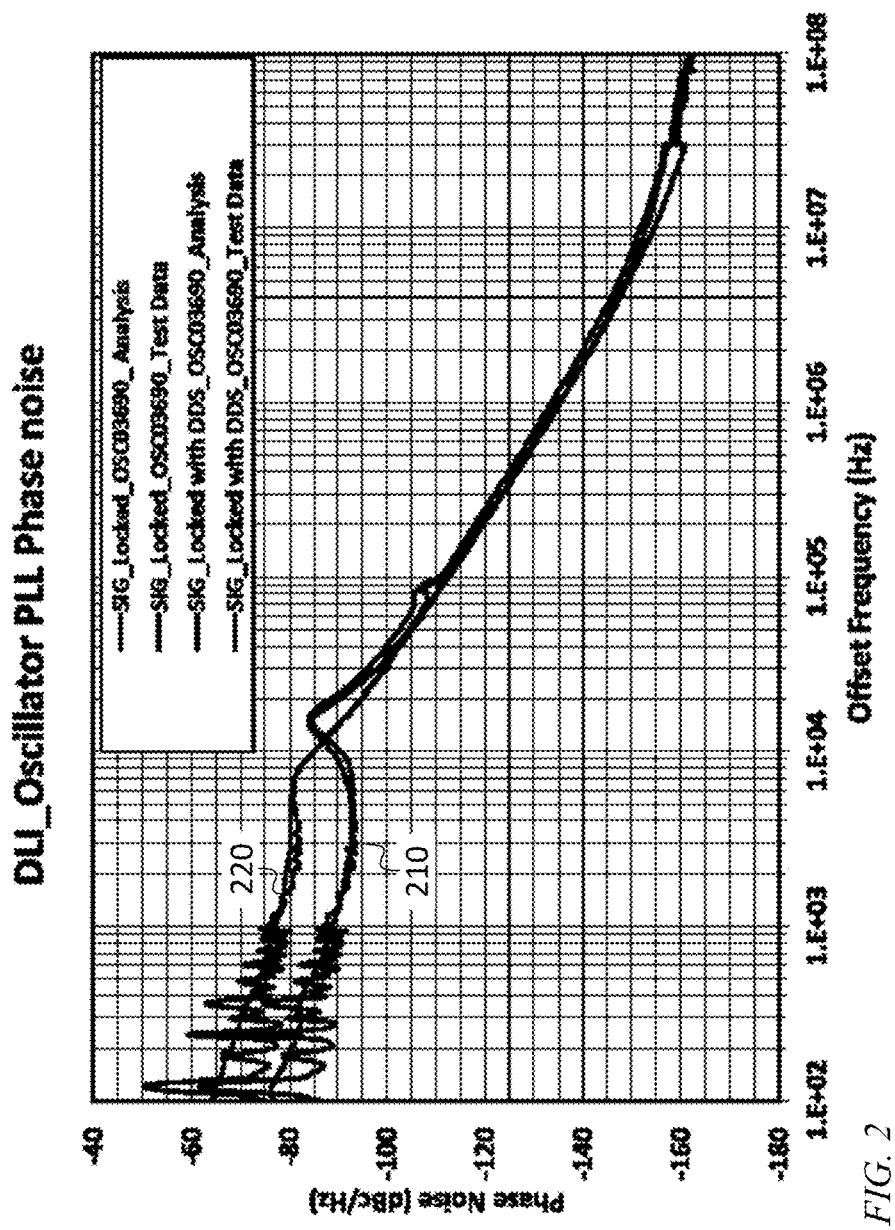
FIG. 2 is a phase noise spectrum of a signal generator, according to an embodiment of the present invention.
Figure 3:
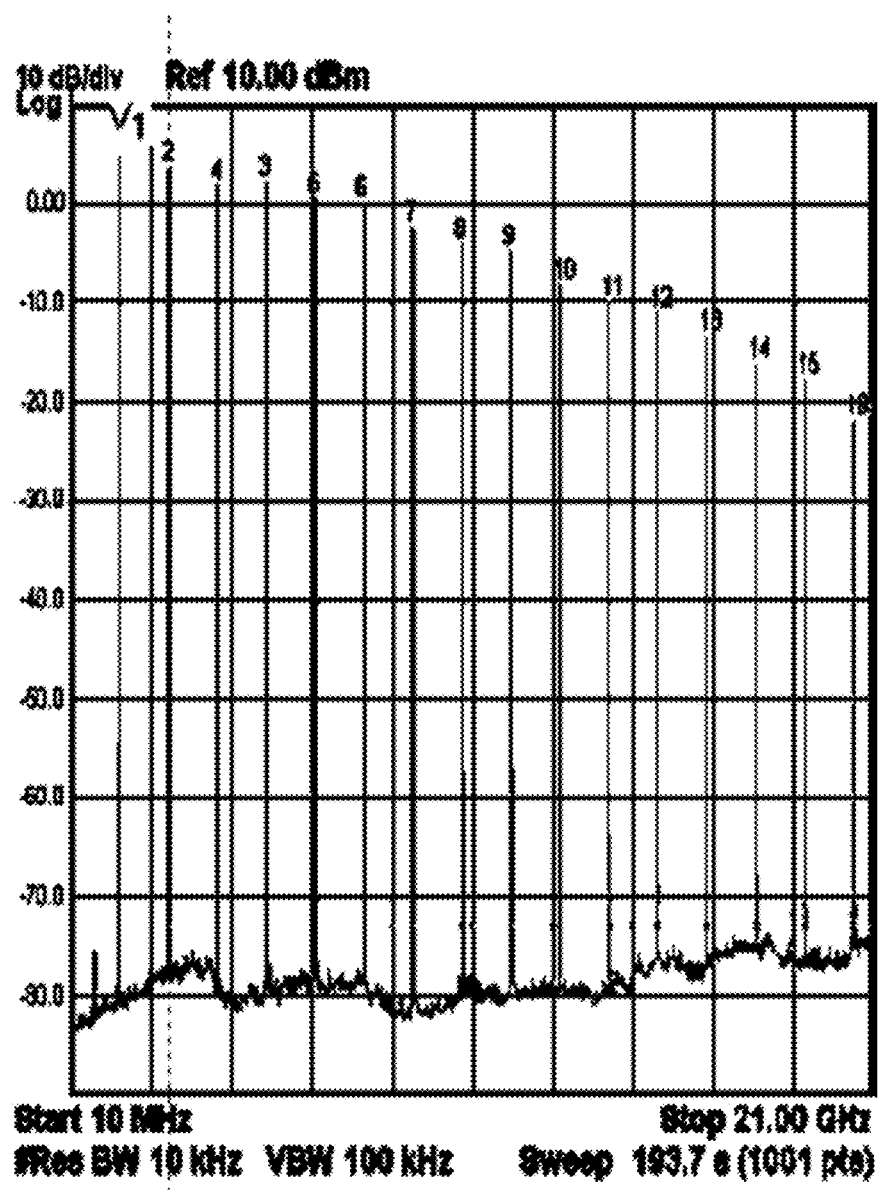
FIG. 3 is a spectrum of a signal generator, according to an embodiment of the present invention.
Figure 4:
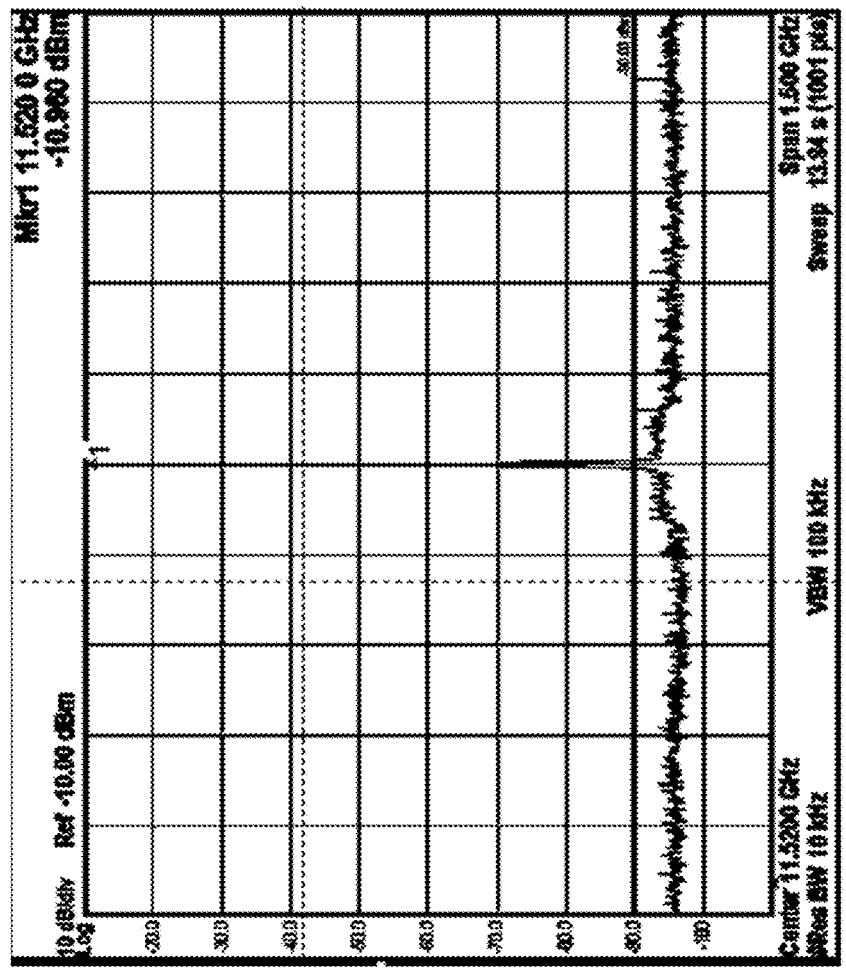
FIG. 4 is a spectrum of a signal generator, according to an embodiment of the present invention.

FIG. 2 shows, in a first pair of curves 210, the phase noise at the output of a circuit according to FIGS. 1A-1D, and, in a second pair of curves 220, the phase noise of a similar circuit, in which a digital frequency divider is used instead of the direct digital synthesizer 120. FIG. 3 shows a comb of harmonics measured at the output of a circuit according to one embodiment constructed in accordance with FIGS. 1A-1D; the power of the first harmonic is 7.45 dBm, and all of the spurious tones are at levels of −73 dBm or less. FIG. 4 shows an enlarged view of the power spectrum of the output of a circuit according to FIGS. 1A-1D. The spectrum is centered on 11.52 GHz and shows an output power of −10.96 dBm at 11.52 GHz. All of the spurious tones are at levels of −73 dBm or less.

The controller for controlling the direct digital synthesizer 120 (and which may also control other aspects of system operation) may be a processing circuit. The term "processing circuit" (or "processing means") is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example a processing circuit may include two processing circuits, an FPGA and a CPU, interconnected on a PCB.

Although limited embodiments of a phase noise reducer have been specifically described and illustrated herein, many modifications and variations will be apparent to those skilled in the art. Accordingly, it is to be understood that a phase noise reducer employed according to principles of this invention may be embodied other than as specifically described herein. The invention is also defined in the following claims, and equivalents thereof.

What is claimed is:

1. A signal generator, comprising:
a voltage controlled oscillator;
a comb generator having an input operatively coupled to an output of the voltage controlled oscillator, the comb generator being a nonlinear transmission line;
a first filter having an input connected to an output of the comb generator;
a first frequency divider having an input connected to an output of, and configured to receive an output signal from, the first filter; and
a signal comparator having a feedback input connected to an output of the first frequency divider and a reference input, the signal comparator having a first output and being configured to generate at the first output a signal that is a measure of:
a phase difference; or
a frequency difference between a signal at the feedback input and a signal at the reference input,
the first output of the signal comparator being operatively coupled to a control input of the voltage controlled oscillator.

2. The signal generator of claim 1, wherein the first filter is a bandpass filter.

3. The signal generator of claim 1, further comprising an amplifier having an input connected to the output of the voltage controlled oscillator and an output connected to the input of the comb generator.

4. The signal generator of claim 3, wherein the amplifier is configured to provide, to the nonlinear transmission line, a signal having a power of between 18 dBm and 24 dBm.

5. The signal generator of claim 1, wherein the signal generator is capable of generating a signal with a power of at least −12 dBm at a first frequency, the first frequency being at least 10 GHz, and with maximum spurious levels, within a 1 GHz span centered on the first frequency, of less than −65 dBm.

6. The signal generator of claim 1, wherein the first frequency divider is a direct digital synthesizer.

7. The signal generator of claim 1, further comprising:
a second frequency divider connected between the voltage controlled oscillator and the comb generator.

8. A signal generator, comprising:
a voltage controlled oscillator;
a comb generator having an input operatively coupled to an output of the voltage controlled oscillator;
a first filter having an input connected to an output of the comb generator;
a first frequency divider having an input connected to an output of, and configured to receive an output signal from, the first filter; and
a signal comparator having a feedback input connected to an output of the first frequency divider and a reference input, the signal comparator having a first output and being configured to generate at the first output a signal that is a measure of:
a phase difference; or
a frequency difference
between a signal at the feedback input and a signal at the reference input,
the first output of the signal comparator being operatively coupled to a control input of the voltage controlled oscillator,
wherein the first frequency divider is a direct digital synthesizer.

9. The signal generator of claim 8, wherein the direct digital synthesizer has a frequency ratio between 2 and 20.

10. The signal generator of claim 9, further comprising a processing circuit configured to control the frequency ratio of the direct digital synthesizer.

11. The signal generator of claim 10, wherein the processing circuit is further configured to adjust the frequency ratio monotonically up or monotonically down, during an interval of time.

12. The signal generator of claim 9, wherein the comb generator is a nonlinear transmission line.

13. The signal generator of claim 12, wherein the first filter is a bandpass filter.

14. The signal generator of claim 13, wherein the signal comparator is a phase and frequency detector.

15. The signal generator of claim 14, further comprising a second filter connected between the phase and frequency detector and the voltage controlled oscillator, the second filter being a lowpass filter.

16. The signal generator of claim 8, further comprising an amplifier having an input connected to the output of the voltage controlled oscillator and an output connected to the input of the comb generator, wherein the comb generator is a nonlinear transmission line.

17. The signal generator of claim 16, wherein the amplifier is configured to provide, to the nonlinear transmission line, a signal having a power of between 18 dBm and 24 dBm.

18. A signal generator, comprising:
a voltage controlled oscillator;
a comb generator having an input operatively coupled to an output of the voltage controlled oscillator;
a first filter having an input connected to an output of the comb generator;
a first frequency divider having an input connected to an output of, and configured to receive an output signal from, the first filter;
a signal comparator having a feedback input connected to an output of the first frequency divider and a reference input, the signal comparator having a first output and being configured to generate at the first output a signal that is a measure of:
a phase difference; or
a frequency difference
between a signal at the feedback input and a signal at the reference input,
the first output of the signal comparator being operatively coupled to a control input of the voltage controlled oscillator; and
a second frequency divider connected between the voltage controlled oscillator and the comb generator.

19. The signal generator of claim 18, wherein the second frequency divider is configured to receive from the voltage controlled oscillator a signal having a first frequency and to feed to the comb generator a signal having a frequency that is ½ of the first frequency.

20. The signal generator of claim 18, further comprising an amplifier having an input connected to the output of the second frequency divider and an output connected to the input of the comb generator.

21. The signal generator of claim 20, wherein the comb generator is a nonlinear transmission line.

22. The signal generator of claim 18, wherein the first frequency divider is a direct digital synthesizer.

23. The signal generator of claim 22, wherein the direct digital synthesizer has a frequency ratio between 2 and 20.

24. The signal generator of claim 23, further comprising a processing circuit configured to control the frequency ratio of the direct digital synthesizer.

25. The signal generator of claim 24, wherein the processing circuit is further configured to adjust the frequency ratio monotonically up or monotonically down, during an interval of time.

26. The signal generator of claim 18, wherein the first filter is a bandpass filter.

27. The signal generator of claim 18, wherein the signal comparator is a phase and frequency detector.

28. The signal generator of claim 27, further comprising a second filter connected between the phase and frequency detector and the voltage controlled oscillator, the second filter being a lowpass filter.

* * * * *